(12) United States Patent
Miura

(10) Patent No.: US 12,387,341 B2
(45) Date of Patent: Aug. 12, 2025

(54) PATTERN MATCHING METHOD

(71) Applicant: TASMIT, INC., Yokohama (JP)

(72) Inventor: Yuji Miura, Yokohama (JP)

(73) Assignee: TASMIT, INC., Yokohama (JP)

(*) Notice: Subject to any disclaimer, the term of this patent is extended or adjusted under 35 U.S.C. 154(b) by 426 days.

(21) Appl. No.: 17/918,422

(22) PCT Filed: Apr. 9, 2021

(86) PCT No.: PCT/JP2021/015017
§ 371 (c)(1),
(2) Date: Oct. 12, 2022

(87) PCT Pub. No.: WO2021/210505
PCT Pub. Date: Oct. 21, 2021

(65) Prior Publication Data
US 2023/0147149 A1 May 11, 2023

(30) Foreign Application Priority Data
Apr. 17, 2020 (JP) .................. 2020-074033

(51) Int. Cl.
G06T 7/13 (2017.01)
G01N 23/2251 (2018.01)

(52) U.S. Cl.
CPC .......... G06T 7/13 (2017.01); G01N 23/2251 (2013.01); G01N 2223/611 (2013.01)

(58) Field of Classification Search
None
See application file for complete search history.

(56) References Cited

U.S. PATENT DOCUMENTS

2004/0017561 A1* 1/2004 Meeks .............. G01B 11/303
257/E21.53
2005/0146714 A1 7/2005 Kitamura et al.
(Continued)

FOREIGN PATENT DOCUMENTS

JP H 05324836 A 5/1992
JP 2009-141124 A 6/2009
(Continued)

OTHER PUBLICATIONS

Vikram, Abhishek, Vineeta Agarwal, and Anshul Agarwal. "Cad layout analysis for defect inspection in semiconductor fabrication." IETE Journal of Research 66.5 (2020): 677-684. (Year: 2020).*
(Continued)

Primary Examiner — Michelle M Entezari Hausmann
(74) Attorney, Agent, or Firm — Cozen O'Connor

(57) ABSTRACT

The method includes: determine a first integrated value by integrating measured values of widths of reference patterns (210A) belonging to a first group; determine a second integrated value by integrating measured values of widths of reference patterns (210B) belonging to a second group; performing second matching between patterns on an image of a second region and corresponding CAD patterns; determining a third integrated value by integrating measured values of widths of patterns (220A) belonging to a first group; determining a fourth integrated value by integrating measured values of widths of patterns (220B) belonging to a second group; and determining that the second matching has been performed correctly when the magnitude relationship between the third integrated value and the fourth integrated value coincides with the magnitude relationship between the first integrated value and the second integrated value.

10 Claims, 14 Drawing Sheets

(56) References Cited

U.S. PATENT DOCUMENTS

| | | | |
|---|---|---|---|
| 2006/0220021 A1* | 10/2006 | Yamazaki | H10D 86/021 |
| | | | 257/E27.111 |
| 2009/0146057 A1 | 6/2009 | Sohda et al. | |
| 2013/0056244 A1* | 3/2013 | Srinivas | H05K 1/0298 |
| | | | 174/250 |
| 2015/0193918 A1 | 7/2015 | Touya et al. | |
| 2017/0138725 A1 | 5/2017 | Kawada et al. | |
| 2017/0148689 A1* | 5/2017 | Park | H01L 21/0274 |
| 2018/0238816 A1* | 8/2018 | Sousa | G06T 7/001 |
| 2020/0380655 A1* | 12/2020 | Chu | G06F 18/231 |

FOREIGN PATENT DOCUMENTS

| | | |
|---|---|---|
| JP | 2012-519391 A | 8/2012 |
| TW | 200919238 A | 5/2009 |
| WO | WO 2010/103506 A1 | 9/2010 |
| WO | WO 2016002341 A1 | 1/2016 |
| WO | WO 2020/195304 A1 | 10/2020 |

OTHER PUBLICATIONS

International Patent Application No. PCT/JP2021/015017; International Search Report and Written Opinion dated May 18, 2021, 7 pgs.

\* cited by examiner

FIG. 16
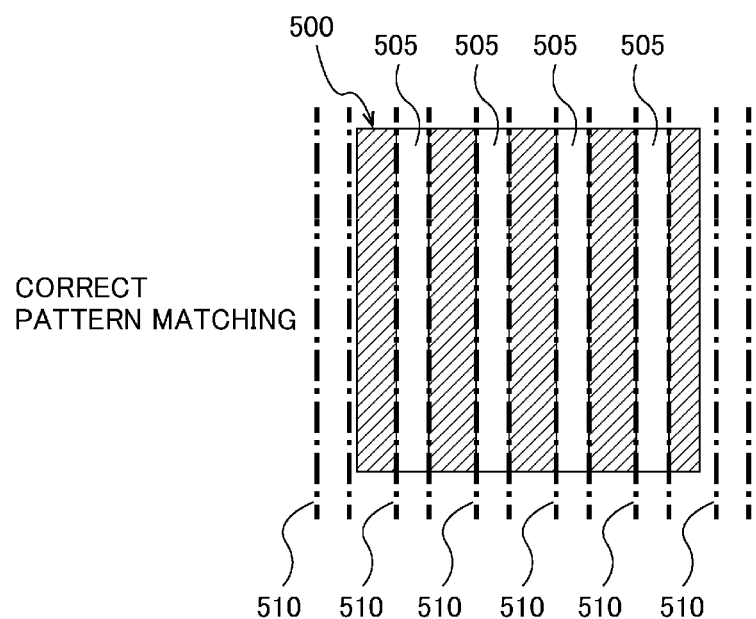
CORRECT PATTERN MATCHING
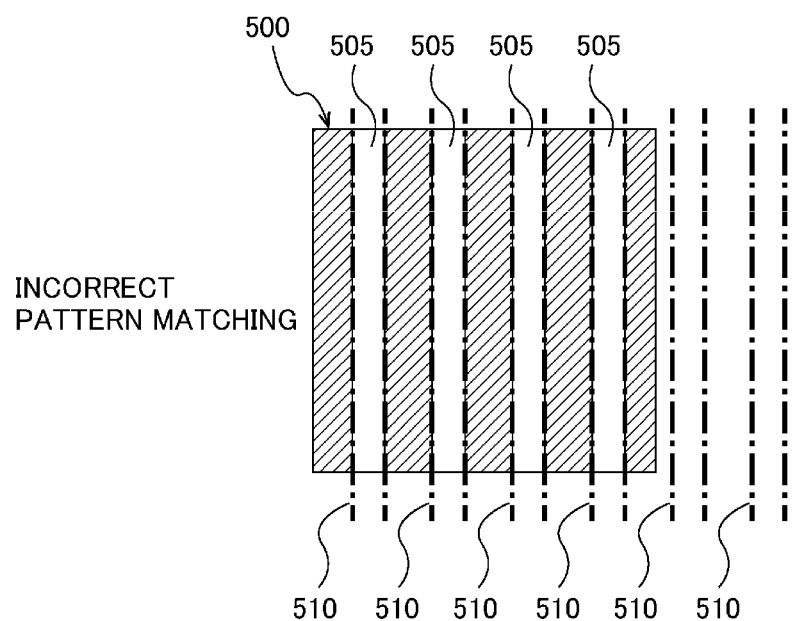
INCORRECT PATTERN MATCHING

PATTERN MATCHING METHOD

CROSS-REFERENCE TO RELATED APPLICATIONS

This application is a 35 U.S.C. § 371 filing of International Application No. PCT/JP2021/015017 filed Apr. 9, 2021, which claims the benefit of priority to Japanese Patent Application No. 2020-074033 filed Apr. 17, 2020, each of which is incorporated herein by reference in its entirety.

TECHNICAL FIELD

The present invention relates to a method of matching a pattern formed on a surface of a workpiece, such as a wafer or a glass substrate, used for manufacturing semiconductor devices with a CAD pattern created from pattern design data.

BACKGROUND ART

A die-to-database method is a pattern matching method for matching a pattern formed on a surface of a workpiece, such as a wafer or a glass substrate, with a CAD pattern created from pattern design data. More specifically, the die-to-database method includes obtaining coordinates of an area to be inspected from design data, moving a stage on which the workpiece is placed to the coordinates, generating an image of a pattern on the workpiece by electron-beam irradiation, superimposing the image and a CAD pattern created from the design data, producing a gray-level profile of the image within a set range starting from an edge of the CAD pattern, determining an edge of the pattern on the image based on the gray-level profile, and determining a matching position that minimize a bias value between the determined edge position and the edge of the corresponding CAD pattern (see, for example, Patent Document 1).

CITATION LIST

Patent Literature

Patent document 1: Japanese laid-open patent publication No. 5-324836
Patent document 2: Japanese laid-open patent publication No. 2012-519391

SUMMARY OF INVENTION

Technical Problem

Double patterning, which is capable of forming a highly integrated circuit having a narrower pattern interval, has recently been attracting attention. The double patterning is a technique of forming a first pattern and a second pattern separately, which are arranged alternately, in two steps. However, in certain areas, a variation in pattern dimension (CD, or Critical Dimension) is likely to occur. Therefore, in such an area, it is necessary to acquire accurate statistical data of CD (Critical Dimension) in order to optimize the process and monitor the process fluctuation.

Patent Document 2 discloses a technique of measuring CD of a pattern 1 and a pattern 2 using only features of a pattern profile of a SEM image. However, with this technique, it is difficult to analyze a problem in design or process because information that can be added to design information other than the measured value of CD cannot be obtained.

The conventional die-to-database method can realize operations of directly specifying an area that is expected to be greatly affected by process fluctuation of the double patterning on the CAD coordinate system in the design data to obtain CD statistical data, and evaluating a CD variation in a memory cell. Furthermore, the die-to-database method can measure the CD while correcting effects of magnification change and rotation of a SEM image using the design data, and can therefore obtain a difference between the CDs and a large amount of accurate design values. In addition, since additional information, such as peripheral pattern information, can be obtained from the design data, the die-to-database method is considered to be most suitable for CD measurement data analysis for the purpose of photomasks and changing of process parameters.

Usually, at an end of a memory cell, a pattern is easily deformed greatly due to influence of the light proximity effect, etc. Therefore, in order to acquire the data of the CD fluctuation caused by the double patterning, it is ideal to perform the CD measurement at the central part of the memory cell. However, in the central part of the memory cell, it is difficult to judge whether the pattern matching is correct or not. For example, as shown in FIG. 16, although repeating patterns 505 on a SEM image 500 match CAD patterns 510 on design data, a pitch shift may occur.

Therefore, the present invention provides a pattern matching method capable of achieving correct matching between a pattern formed by multi-patterning and a corresponding CAD pattern.

Solution to Problem

In an embodiment, there is provided a pattern matching method comprising: generating an image of a first region in a pattern region containing patterns formed by multi-patterning; performing first matching between a plurality of reference patterns on the image of the first region and a plurality of first CAD patterns that have been classified in advance into a first group and a second group according to layer information; classifying the plurality of reference patterns into the first group and the second group according to the layer classification of the first CAD patterns: measuring widths of the plurality of reference patterns belonging to the first group and widths of the plurality of reference patterns belonging to the second group: determining a first integrated value by integrating measured values of the widths of the plurality of reference patterns belonging to the first group; determining a second integrated value by integrating measured values of the widths of the plurality of reference patterns belonging to the second group: determining a magnitude relationship between the first integrated value and the second integrated value: generating an image of a second region in the pattern region; performing second matching between a plurality of patterns on the image of the second region and a plurality of second CAD patterns that have been classified in advance into a first group and a second group according to layer information; classifying the plurality of patterns on the image of the second region into the first group and the second group according to the layer classification of the second CAD patterns; measuring widths of the plurality of patterns belonging to the first group and widths of the plurality of patterns belonging to the second group: determining a third integrated value by integrating measured values of the widths of the plurality of patterns belonging to the first group; determining a fourth integrated value by integrating measured values of the widths of the plurality of patterns belonging to the second group; determining a magnitude relationship between the third integrated value and the fourth integrated value; determining that the second matching has been performed correctly when the magnitude relationship between the third integrated value and the fourth integrated value coincides with the magnitude relationship between the first integrated value and the second integrated value.

In an embodiment, the first region is an edge region including an edge of the pattern region, and the second region is within the pattern region and is located more inwardly than the first region.

In an embodiment, the patterns formed by the multi-patterning are repeating patterns.

In an embodiment, the pattern matching method further comprises: shifting the plurality of patterns on the image of the second region relative to the plurality of second CAD patterns by one pitch when the magnitude relationship between the third integrated value and the fourth integrated value does not coincide with the magnitude relationship between the first integrated value and the second integrated value; and then performing the second matching again.

In an embodiment, an absolute value of a difference between the first integrated value and the second integrated value and an absolute value of a difference between the third integrated value and the fourth integrated value are larger than a predetermined value.

In an embodiment, there is provided a pattern matching method comprising: generating an image of a first region in a pattern region containing patterns formed by multi-patterning; performing first matching between a plurality of reference patterns on the image of the first region and a plurality of first CAD patterns that have been classified in advance into a first group and a second group according to layer information; classifying the plurality of reference patterns into the first group and the second group according to the layer classification of the first CAD patterns; calculating slopes of brightness profiles of edges of the plurality of reference patterns belonging to the first group and slopes of brightness profiles of edges of the plurality of reference patterns belonging to the second group; determining a first integrated value by integrating calculated values of the slopes of the brightness profiles of the edges of the plurality of reference patterns belonging to the first group; determining a second integrated value by integrating calculated values of the slopes of the brightness profiles of the edges of the plurality of reference patterns belonging to the second group; determining a magnitude relationship between the first integrated value and the second integrated value; generating an image of a second region in the pattern region; performing second matching between a plurality of patterns on the image of the second region and a plurality of second CAD patterns that have been classified in advance into a first group and a second group according to layer information; classifying the plurality of patterns on the image of the second region into the first group and the second group according to the layer classification of the second CAD patterns; calculating slopes of brightness profiles of edges of the plurality of patterns belonging to the first group and slopes of brightness profiles of edges of the plurality of patterns belonging to the second group; determining a third integrated value by integrating calculated values of the slopes of the brightness profiles of the edges of the plurality of patterns belonging to the first group; determining a fourth integrated value by integrating calculated values of the slopes of the brightness profiles of the edges of the plurality of patterns belonging to the second group; determining a magnitude relationship between the third integrated value and the fourth integrated value: determining that the second matching has been performed correctly when the magnitude relationship between the third integrated value and the fourth integrated value coincides with the magnitude relationship between the first integrated value and the second integrated value.

In an embodiment, the first region is an edge region including an edge of the pattern region, and the second region is within the pattern region and is located more inwardly than the first region.

In an embodiment, the patterns formed by the multi-patterning are repeating patterns.

In an embodiment, the pattern matching method further comprises: shifting the plurality of patterns on the image of the second region relative to the plurality of second CAD patterns by one pitch when the magnitude relationship between the third integrated value and the fourth integrated value does not coincide with the magnitude relationship between the first integrated value and the second integrated value; and then performing the second matching again.

In an embodiment, an absolute value of a difference between the first integrated value and the second integrated value and an absolute value of a difference between the third integrated value and the fourth integrated value are larger than a predetermined value.

Advantageous Effects of Invention

According to the present invention, accurate pattern matching in the second region can be guaranteed by referring to the magnitude relationship of the pattern width in the first region. In particular, according to the present invention, the measured value of the pattern width can be used for optimizing the process parameters. In addition, it is possible to monitor the pattern width in an area where the process margin is small.

BRIEF DESCRIPTION OF DRAWINGS

FIG. 16 is a diagram explaining a problem that may occur in conventional pattern matching.

DESCRIPTION OF EMBODIMENTS

Hereinafter, embodiments of the present invention will be described with reference to the drawings.

Figure 1:
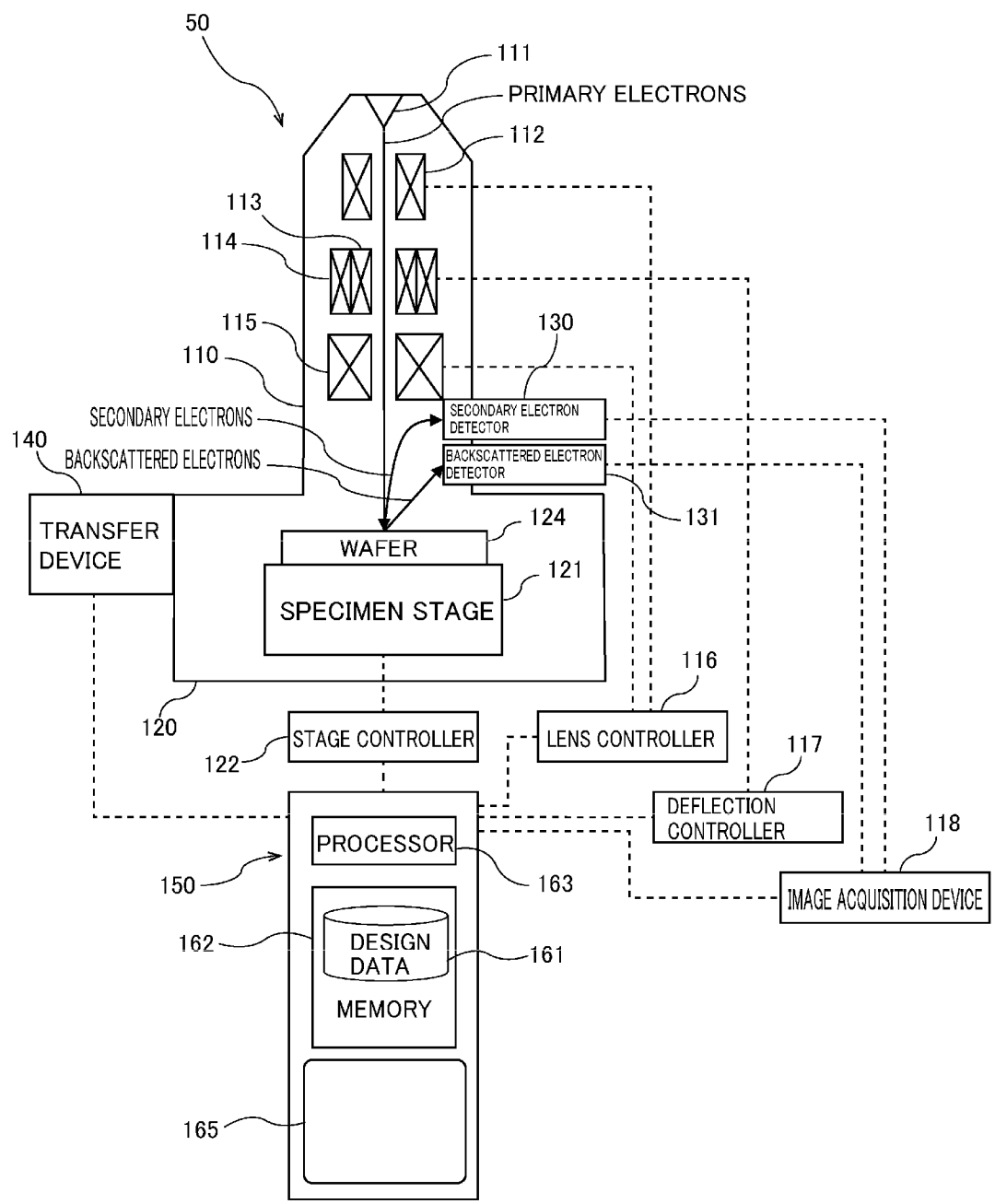
FIG. 1 is a schematic diagram showing an embodiment of an image generating apparatus.

FIG. 1 is a schematic diagram showing an embodiment of an image generation apparatus. As shown in FIG. 1, the image generating apparatus includes a scanning electron microscope 50 and an arithmetic system 150. The scanning electron microscope 50 is coupled to the arithmetic system 150, and operations of the scanning electron microscope 50 are controlled by the arithmetic system 150.

The arithmetic system 150 includes a memory 162 storing a database 161 and programs therein, a processor 163 configured to perform arithmetic operations according to instructions included in the programs, and a display screen 165 configured to display an image and a GUI (graphical user interface). The processor 163 includes a CPU (central processing unit) or a GPU (graphic processing unit) that performs arithmetic operations according to instructions included in the programs stored in the memory 162. The memory 162 includes a main memory (e.g., random access memory) to which the processor 163 is accessible and an auxiliary memory (e.g., hard disk drive or solid state drive) for storing data and the programs.

The arithmetic system 150 includes at least one computer. For example, the arithmetic system 150 may be an edge server coupled to the scanning electron microscope 50 by a communication line, or may be a cloud server coupled to the scanning electron microscope 50 by a communication network, such as the Internet or a local network. The arithmetic system 150 may be a fog computing device (gateway, fog server, router, etc.) installed in a network coupled to the scanning electron microscope 50. The arithmetic system 150 may be a combination of a plurality of servers. For example, the arithmetic system 150 may be a combination of an edge server and a cloud server coupled to each other by a communication network, such as the Internet or a local network. In another example, the arithmetic system 150 may include a plurality of servers (computers) that are not coupled by a network.

The scanning electron microscope 50 includes an electron gun 111 configured to emit an electron beam composed of primary electrons (charged particles), a converging lens 112 configured to converge the electron beam emitted by the electron gun 111, and an X deflector 113 configured to deflect the electron beam in an X direction, a Y deflector 114 configured to deflect the electron beam in a Y direction, and an objective lens 115 configured to focus the electron beam on a wafer 124, which is an example of a workpiece. Configuration of the electron gun 111 is not particularly limited. For example, a field-emitter type electron gun, a semiconductor-photocathode type electron gun, etc. can be used as the electron gun 111.

The converging lens 112 and the objective lens 115 are coupled to a lens controller 116, and operations of the converging lens 112 and the objective lens 115 are controlled by the lens controller 116. The lens controller 116 is coupled to the arithmetic system 150. The X deflector 113 and the Y deflector 114 are coupled to a deflection controller 117, and deflecting operations of the X deflector 113 and the Y deflector 114 are controlled by the deflection controller 117. The deflection controller 117 is also coupled to the arithmetic system 150 as well. A secondary electron detector 130 and a backscattered electron detector 131 are coupled to an image acquisition device 118. The image acquisition device 118 is configured to convert output signals of the secondary electron detector 130 and the backscattered electron detector 131 into image(s). The image acquisition device 118 is also coupled to the arithmetic system 150 as well.

A specimen stage 121 arranged in a specimen chamber 120 is coupled to a stage controller 122, and a position of the specimen stage 121 is controlled by the stage controller 122. The stage controller 122 is coupled to the arithmetic system 150. A transfer device 140 for transporting the wafer 124 onto the specimen stage 121 in the specimen chamber 120 is also coupled to the arithmetic system 150.

The electron beam emitted by the electron gun 111 is converged by the converging lens 112 and then focused by the objective lens 115 on a surface of the wafer 124 while the electron beam is deflected by the X deflector 113 and the Y deflector 114. When the wafer 124 is irradiated with the primary electrons of the electron beam, the secondary electrons and backscattered electrons are emitted from the wafer 124. The secondary electrons are detected by the secondary electron detector 130, and the backscattered electrons are detected by the backscattered electron detector 131. Signals of the detected secondary electrons and signals of the detected backscattered electrons are input to the image acquisition device 118 and converted into image(s). The image is transmitted to the arithmetic system 150.

Design data of patterns formed on the wafer 124 is stored in advance in the memory 162. The design data includes pattern design information, such as coordinates of vertices of each pattern formed on the wafer 124, a position, a shape and a size of each pattern, and the number of a layer to which each pattern belongs. The database 161 is constructed in the memory 162. The design data of patterns is stored in advance in the database 161. The arithmetic system 150 can read out the design data of each pattern from the database 161 stored in the memory 162.

Next, an embodiment of a method of matching between a pattern on an image generated by the scanning electron microscope 50 and a corresponding CAD pattern on the design data will be described. In the following descriptions, an image generated by the scanning electron microscope 50 may be referred to as a SEM image. The pattern of the wafer 124 has been manufactured based on the design data (also referred to as CAD data). CAD is an abbreviation for computer-aided design.

The design data includes design information of the pattern formed on the wafer 124, and specifically, includes design information, such as coordinates of vertices of the pattern, a position, a shape and a size of the pattern, and the number of a layer to which the pattern belongs. The CAD pattern in the design data is a virtual pattern defined by design information of a pattern included in the design data. In the following description, a pattern already formed on the wafer 124 may be referred to as a real pattern.

Figure 2:
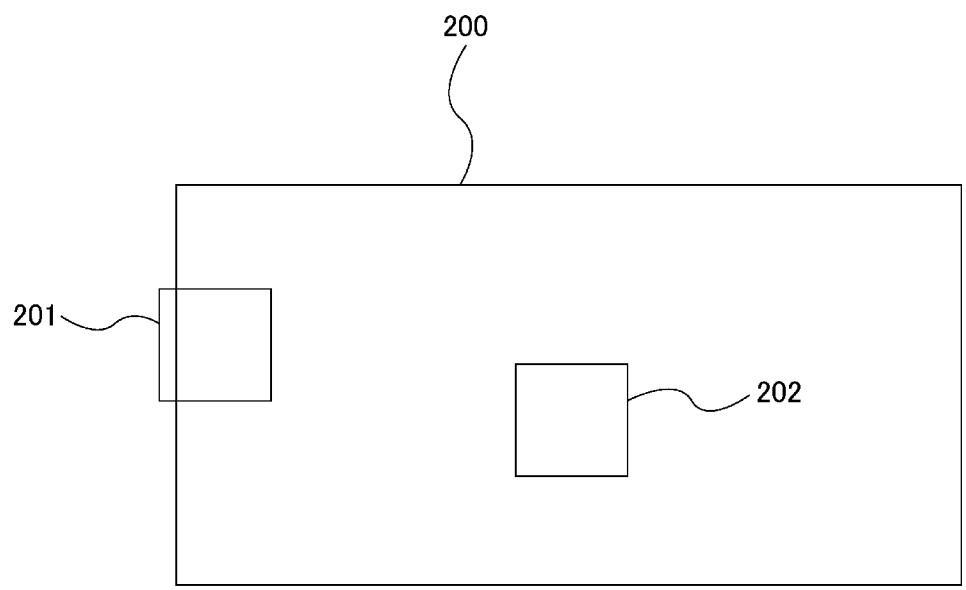
FIG. 2 is a schematic diagram showing a pattern region formed on a wafer.

FIG. 2 is a schematic view showing a pattern region 200 formed on the wafer 124. Patterns formed in the pattern region 200 are real patterns formed by multi-patterning, such as double patterning or quadruple patterning. In the present embodiment, the real patterns formed in the pattern region 200 are line-and-space patterns which are an example of repeating patterns. An example of the pattern region 200 is a memory cell.

First, an image of a first region 201 in the pattern region 200 including patterns formed by the multi-patterning is generated by the scanning electron microscope 50. After the image of the first region 201 is generated, an image of a second region 202, which is different from the first region 201, is generated by the scanning electron microscope 50. The second region 202 is a region within the pattern region 200, as well as the first region 201. Sizes of the first region 201 and the second region 202 are not particularly limited, but are, for example, a size of a field of view (FOV) of the scanning electron microscope 50 or a size of a combination of a plurality of fields of view of the scanning electron microscope 50.

The first region 201 is a region including a distinctive pattern whose position can be specified in order to ensure that subsequent first matching and second matching can be performed correctly. In the present embodiment, the first region 201 is an edge region including an edge of the pattern region 200. The second region 202 is located within the pattern region 200 and located more inwardly than the first region 201.

Figure 3:
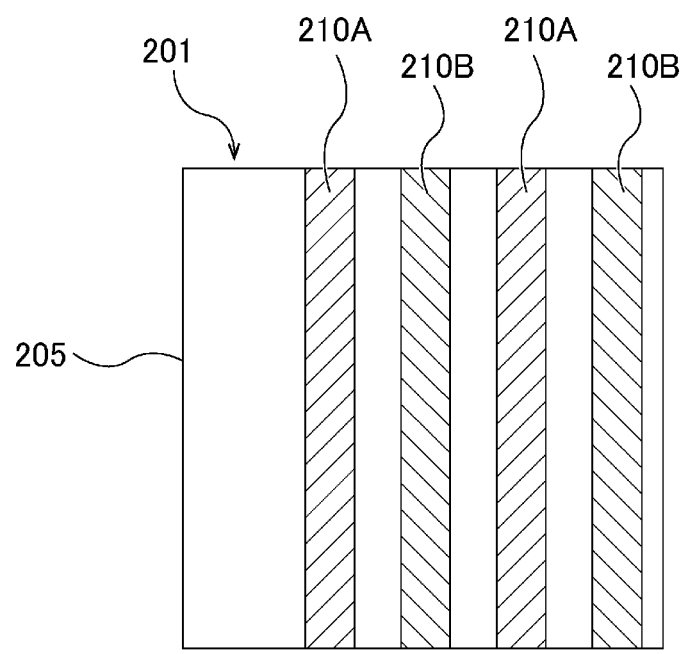
FIG. 3 is a schematic diagram showing an example of an image of a first region.

FIG. 3 is a schematic diagram showing an example of an image 205 of the first region 201. As shown in FIG. 3, patterns in the first region 201 include two sets of patterns 210A and 210B individually formed by the double patterning. These patterns 210A and 210B are arranged alternately. The patterns 210A and 210B in the first region 201 are repeating patterns including the edge of the pattern region 200. Specifically, an outermost pattern 210A is a distinctive pattern whose position can be specified. Therefore, although these patterns 210A and 210B are repeating patterns, accurate pattern matching is ensured. In the following description, the patterns 210A and 210B on the image 205 of the first region 201 are referred to as reference patterns. The number of reference patterns 210A and 210B included in the first region 201 is not limited to the example shown in FIG. 3.

As shown in FIG. 3, the reference patterns 210A and 210B do not include a pattern end. Specifically, each of the reference patterns 210A and 210B extends across the entire first region 201. The reason why the reference patterns 210A and 210B do not include the pattern end is that pattern shrinkage is likely to occur at the pattern end and a correct pattern width may not be measured. The size and position of the first region 201 can be set manually or automatically. A plurality of first regions 201 may be provided.

Figure 4:
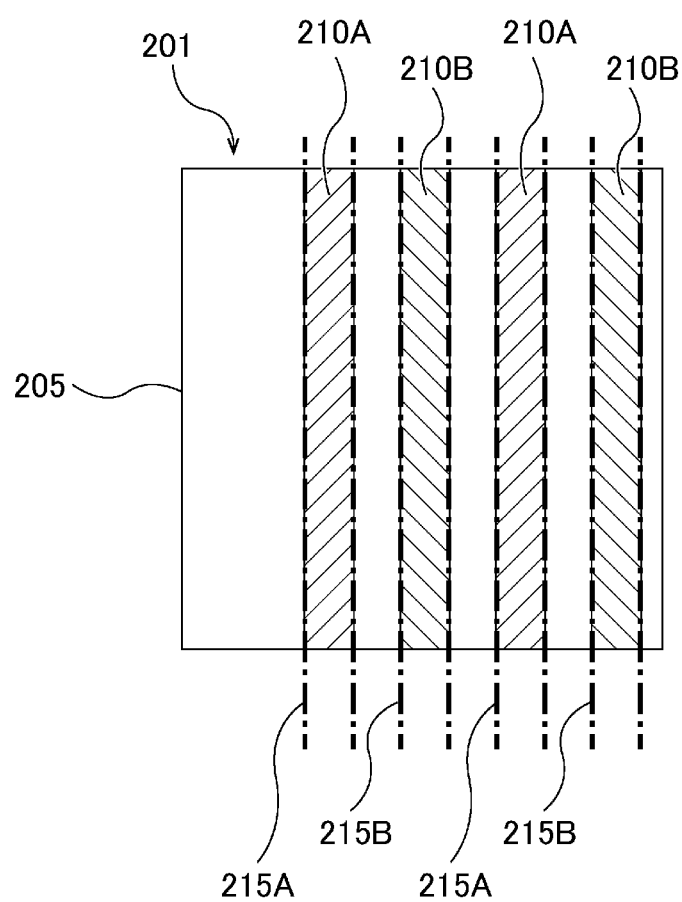
FIG. 4 is a diagram explaining first matching of a plurality of reference patterns on the image of the first region and a plurality of corresponding CAD patterns.

Next, as shown in FIG. 4, the arithmetic system 150 performs the first matching between the plurality of reference patterns 210A and 210B on the image 205 of the first region 201 and a plurality of corresponding CAD patterns 215A and 215B. The CAD patterns 215A and 215B are classified in advance into a first group and a second group according to layer information of these CAD patterns. In the example shown in FIG. 4, the CAD patterns 215A are classified into the first group, and the CAD patterns 215B are classified into the second group. The CAD patterns 215A and 215B are created by the arithmetic system 150 based on the design data of the reference patterns 210A and 210B.

The first matching is performed as follows. The arithmetic system 150 superimposes one of the SEM image 205 and the CAD patterns 215A and 215B on another, and produces gray-level profiles of the SEM image 205 within a range set starting from the edges of the CAD patterns 215A and 215B created from the design data. Then, the arithmetic system 150 determines edges of the reference patterns 210A and 210B on the SEM image 205 from the gray-level profiles, and determines a matching position that can minimize bias values between positions of the determined edges and positions of the edges of the corresponding CAD patterns 215A and 215B. Each of the bias values is an index value indicating an amount of deviation (or a distance) between an edge determined from each gray-level profile and each edge of the corresponding CAD patterns 215A and 215B. The bias values are calculated for all edges in the SEM image 205.

Figure 5:
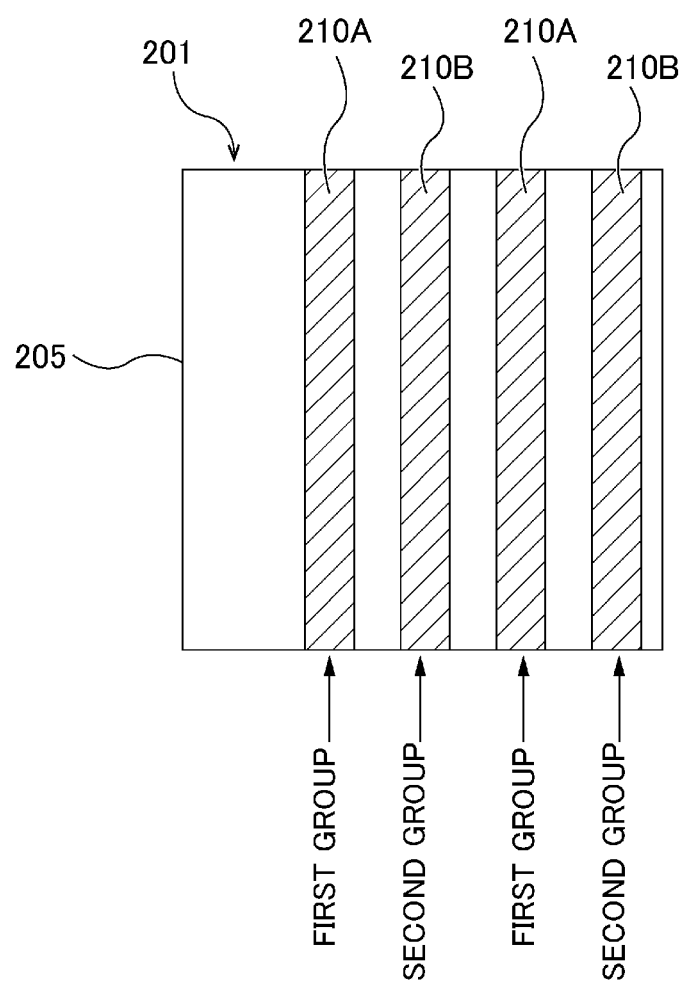
FIG. 5 is a diagram illustrating a process of classifying a plurality of reference patterns on an SEM image into a first group and a second group.

As shown in FIG. 5, the arithmetic system 150 classifies the plurality of reference patterns 210A and 210B on the SEM image 205 into the first group and the second group according to the layer classification of the CAD patterns 215A and 215B. The layer classification of CAD patterns 215A and 215B is predetermined based on a pattern-formation order of the multi-patterning (double patterning in this embodiment). In the example shown in FIG. 5, the arithmetic system 150 classifies the odd-numbered reference patterns 210A into the first group and the even-numbered reference patterns 210B into the second group. Depending on the layer classification of the CAD patterns 215A and 215B, the arithmetic system 150 may classify the even-numbered reference patterns 210B into the first group and the odd-numbered reference patterns 210A into the second group.

Next, the arithmetic system 150 measures widths of the plurality of reference patterns 210A belonging to the first group and widths of the plurality of reference patterns 210B belonging to the second group. The measured values of the widths of the reference patterns 210A and 210B are CD (Critical Dimension) values of the reference patterns 210A and 210B. A process of measuring the widths of the reference patterns 210A and 210B is not particularly limited. In one example, the arithmetic system 150 may calculate the sum of an average of the bias values of each reference pattern and a width of the corresponding CAD pattern, and may use the calculated sum as a measured value of the width (i.e., a CD value). In another example, the arithmetic system 150 may measure a distance between peaks of a brightness profile of each reference pattern. In general, a brightness of an edge of a pattern on an image may be higher than those of other parts of the pattern. Therefore, the distance between the peaks of the brightness profile can be used as a measured value of the width of the reference pattern.

The arithmetic system 150 determines a first integrated value by integrating the measured values of the widths of the plurality of reference patterns 210A belonging to the first group, and determines a second integrated value by integrating the measured values of the widths of the plurality of reference patterns 210B belonging to the second group.

Further, the arithmetic system 150 compares the first integrated value and the second integrated value, and determines a magnitude relationship between the first integrated value and the second integrated value. Specifically, the arithmetic system 150 determines which of the first integrated value and the second integrated value is larger than the other. The arithmetic system 150 stores the determined magnitude relationship between the first integrated value and the second integrated value in the memory 162.

The reference patterns 210A belonging to the first group and the reference patterns 210B belonging to the second group are real patterns formed by individual steps in the multi-patterning. Usually, in the multi-patterning, widths of real patterns formed by individual steps are slightly different. Therefore, the widths of the reference patterns 210A belonging to the first group and the widths of the reference patterns 210B belonging to the second group are also slightly different. The first integrated value calculated for the first group and the second integrated value calculated for the second group reflect the widths of the reference patterns 210A and 210B belonging to these two groups.

Figure 6:
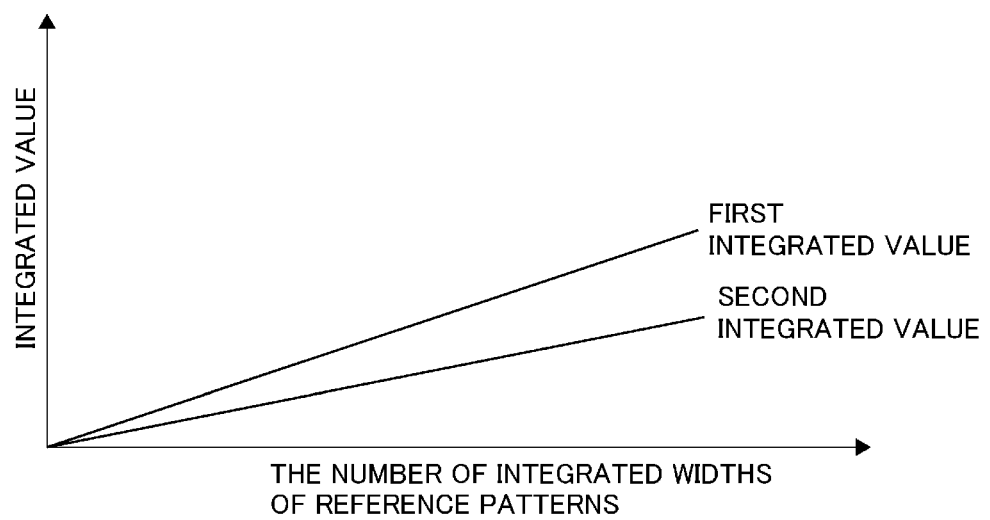
FIG. 6 is a graph showing a relationship between the number of integrated widths of reference patterns and first and second integrated values.

FIG. 6 is a graph showing a relationship between the number of integrated widths of the reference patterns and the first and second integrated values. As can be seen from FIG. 6, as the number of integrated widths of the reference patterns 210A and 210B increases, the difference between the first integrated value and the second integrated value increases. The difference between the width of each reference pattern 210A belonging to the first group and the width of each reference pattern 210B belonging to the second group is extremely small, but there is a significant difference between the first integrated value and the second integrated value. Therefore, the arithmetic system 150 can determine either the width of the reference pattern 210A belonging to the first group or the width of the reference pattern 210B belonging to the second group is larger than the other based on the difference between the first integrated value and the second integrated value. In the example shown in FIG. 6, the magnitude relationship between the first integrated value and the second integrated value is such that the first integrated value is larger than the second integrated value.

In order to determine the magnitude relationship between the first integrated value and the second integrated value, it is desirable that there is a significant difference between the first integrated value and the second integrated value. From this point of view, the number of integrated reference patterns may be a preset number or more. Alternatively, the arithmetic system 150 may integrate the measured values of the widths of the plurality of reference patterns 210A belonging to the first group and integrate the measured values of the widths of the plurality of reference patterns 210B belonging to the second group until an absolute value of the difference between the first integrated value and the second integrated value exceeds a predetermined value. In order to increase the number of reference patterns existing in the first region 201, the field of view (FOV) may be increased or a plurality of fields of view may be combined.

Figure 7:
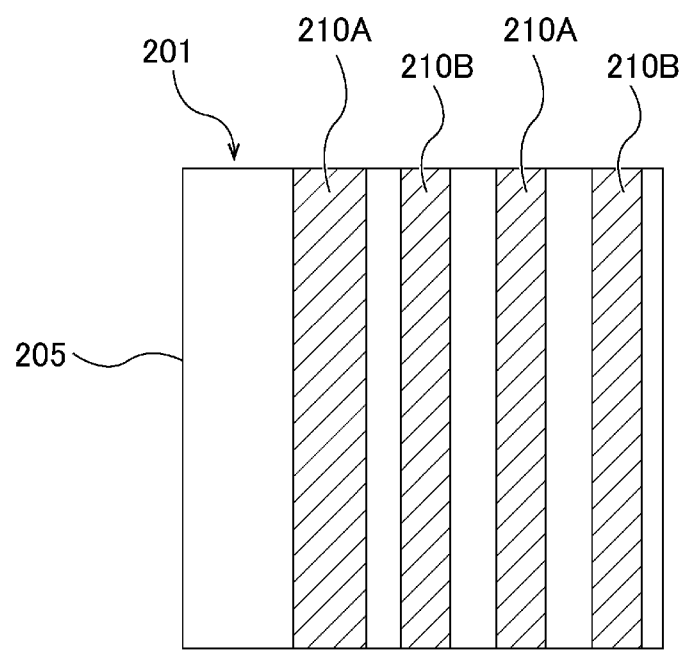
FIG. 7 is a schematic diagram showing another example of patterns in the first region.

In general, an outermost pattern in the pattern region 200 may have a width significantly different from other patterns due to the influence of a light proximity effect etc., as shown in FIG. 7. Therefore, the arithmetic system 150 may calculate the first integrated value and the second integrated value without using at least one reference pattern at the outermost side in the first region 201. In one embodiment, the arithmetic system 150 may exclude reference pattern(s) having a width exceeding a threshold value from the plurality of reference patterns 210A and 210B in the first region 201, and then calculate the first integrated value and the second integrated value.

Figure 8:
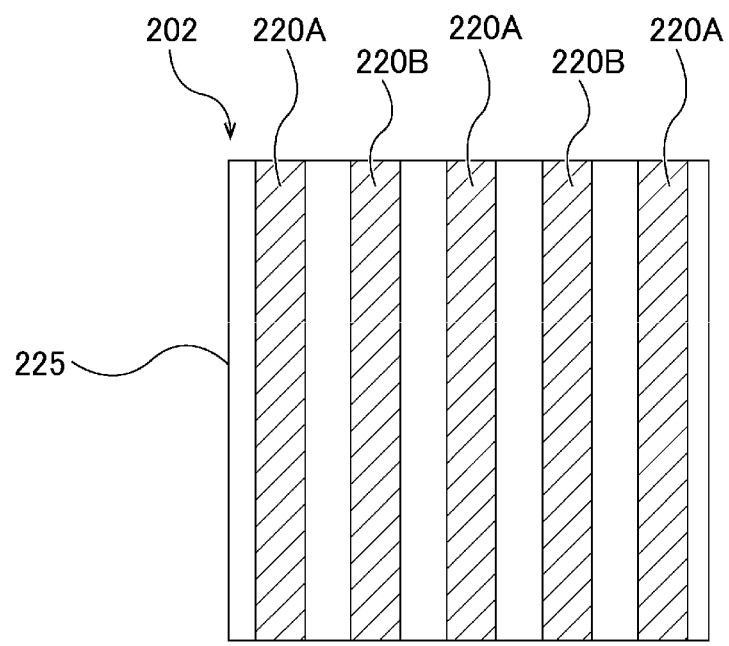
FIG. 8 is a schematic diagram showing an example of an image of a second region.

The arithmetic system 150 calculates integrated values for patterns in the second region 202 shown in FIG. 2 in the same manner as the reference patterns 210A and 210B in the first region 201. FIG. 8 is a schematic diagram showing an example of an image 225 of the second region 202. As shown in FIG. 8, patterns in the second region 202 include two sets of patterns 220A and 220B individually formed by the double patterning, as well as the reference patterns 210A and 210B in the first region 201. These patterns 220A and 220B are arranged alternately.

The patterns 220A and 220B in the second region 202 are repeating patterns that do not include an edge of the pattern region 200 (see FIG. 2). In one example, the second region 202 is located at the center of the pattern region 200 shown in FIG. 2. As can be seen from FIG. 8, the patterns 220A and 220B in the second region 202 extend across the entire second region 202 and do not have a distinctive shape that enables a position to be specified. The size and position of the second region 202 can be set manually or automatically. The number of patterns 220A and 220B included in the second region 202 is not limited to the example shown in FIG. 8.

Figure 9:
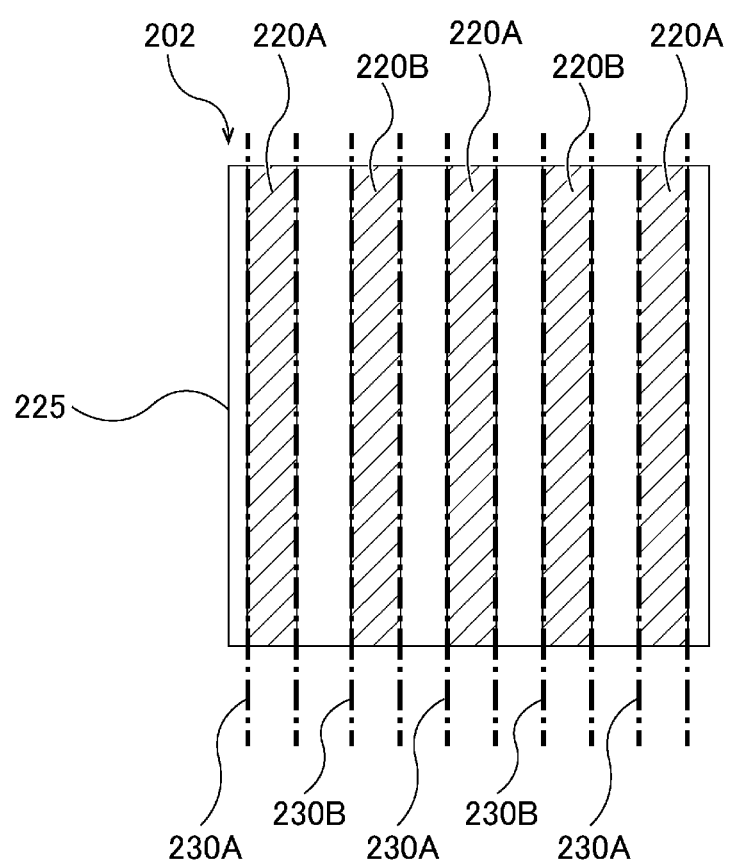
FIG. 9 is a diagram illustrating second matching between a plurality of patterns on the image of the second region and a plurality of corresponding CAD patterns.

As shown in FIG. 9, the arithmetic system 150 performs a second matching between the plurality of patterns 220A and 220B on the image 225 of the second region 202 and a plurality of corresponding CAD patterns 230A and 230B. The CAD patterns 230A and 230B are classified in advance into a first group and a second group according to layer information of these CAD patterns. In the example shown in FIG. 9, the CAD patterns 230A are classified into the first group, and the CAD patterns 230B are classified into the second group. Since the second matching is performed in the same manner as the first matching described above, the repetitive descriptions thereof will be omitted.

Figure 10:
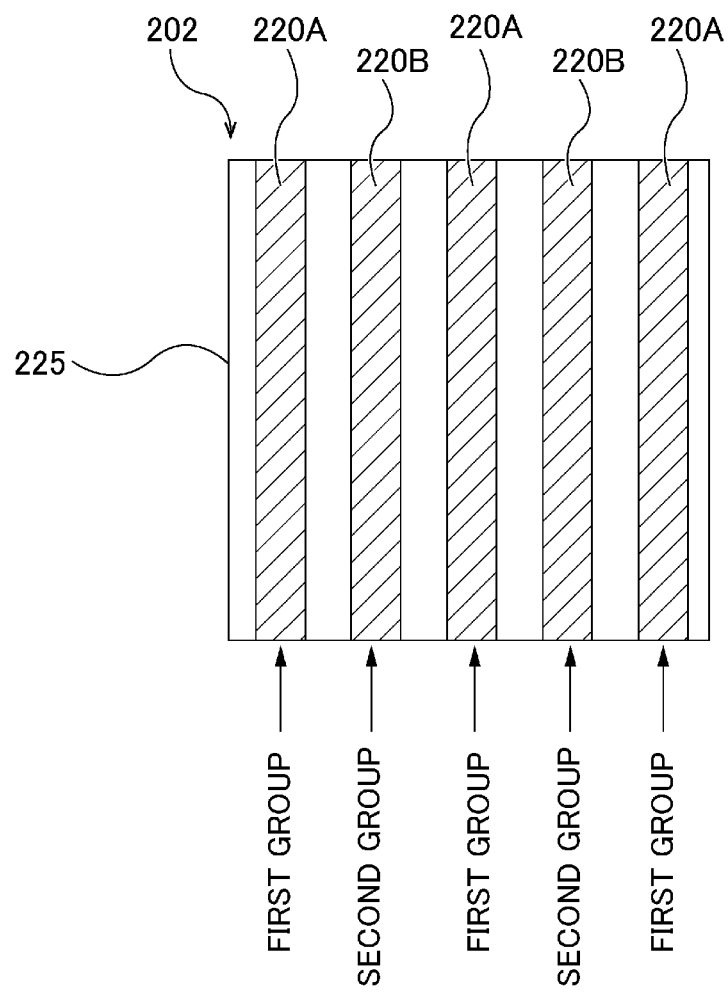
FIG. 10 is a diagram illustrating a process of classifying a plurality of patterns on an SEM image into a first group and a second group.

As shown in FIG. 10, the arithmetic system 150 classifies the plurality of patterns 220A and 220B on the SEM image 225 into the first group and the second group according to the layer classification of the CAD patterns 230A and 230B. In the present embodiment, the arithmetic system 150 classifies the odd-numbered patterns 220A into the first group and the even-numbered patterns 220B into the second group. Then, the arithmetic system 150 measures widths of the plurality of patterns 220A belonging to the first group and widths of the plurality of patterns 220B belonging to the second group.

The arithmetic system 150 determines a third integrated value by integrating the measured values of the widths of the plurality of patterns 220A belonging to the first group, and determines a fourth integrated value by integrating the measured values of the widths of the plurality of patterns 220B belonging to the second group. Furthermore, the arithmetic system 150 compares the third integrated value and the fourth integrated value, and determines a magnitude relationship between the third integrated value and the fourth integrated value. Specifically, the arithmetic system 150 determines which of the third integrated value and the fourth integrated value is larger than the other. The arithmetic system 150 stores the determined magnitude relationship between the third integrated value and the fourth integrated value in the memory 162.

Similar to the first integrated value and the second integrated value, the number of integrated patterns may be a preset number or more. Alternatively, the arithmetic system 150 may integrate the measured values of the widths of the plurality of patterns 220A belonging to the first group and integrate the measured values of the widths of the plurality of patterns 220B belonging to the second group until an absolute value of the difference between the third integrated value and the fourth integrated value exceeds a predetermined value. In order to increase the number of patterns existing in the second region 202, the field of view (FOV) may be increased or a plurality of fields of view may be combined.

Next, the arithmetic system 150 determines that the second matching is performed correctly when the magnitude relationship between the third integrated value and the fourth integrated value matches the magnitude relationship between the first integrated value and the second integrated value. In the example shown in FIG. 6, since the first integrated value is larger than the second integrated value, the arithmetic system 150 determines that the magnitude relationship between the third integrated value and the fourth integrated value coincides with the magnitude relationship between the first integrated value and the second integrated value when the third integrated value is larger than the fourth integrated value.

The arithmetic system 150 displays on the display screen 165 the first integrated value, the second integrated value, the third integrated value, the fourth integrated value, the difference between the first integrated value and the second integrated value, the difference between the third integrated value and the fourth integrated value, etc. An operator can visually confirm the results displayed on the display screen 165.

When the magnitude relationship between the third integrated value and the fourth integrated value does not coincide with the magnitude relationship between the first integrated value and the second integrated value (e.g., when the third integrated value is smaller than the fourth integrated value), it is presumed that the third integrated value is an integrated value of the widths of the plurality of patterns belonging to the second group, and the fourth integrated value is an integrated value of the widths of the plurality of patterns belonging to the first group. Therefore, in this case, the arithmetic system 150 shifts the plurality of patterns 220A and 220B on the image 225 of the second region 202 by one pitch relative to the plurality of corresponding CAD patterns 230A and 230B, and then performs the second matching again.

According to the present embodiment, accurate pattern matching in the second region 202 can be ensured with reference to the magnitude relationship of the pattern widths in the first region 201. In particular, according to the present embodiment, the measured values of the pattern widths can be used for optimizing process parameters. In addition, it is possible to monitor pattern widths in a region where a process margin is small.

Figure 11:
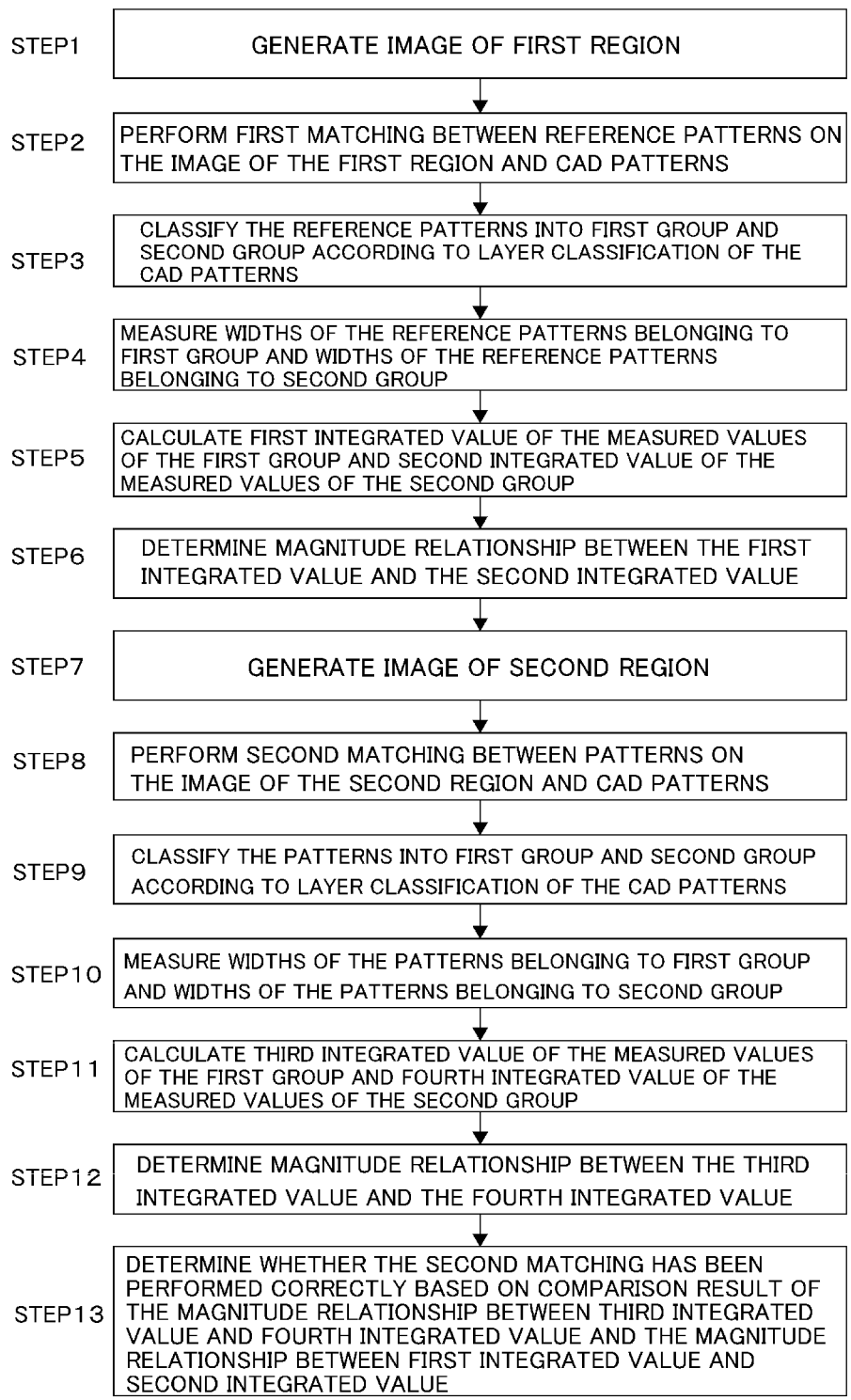
FIG. 11 is a flowchart explaining an embodiment of a pattern matching method.

FIG. 11 is a flowchart illustrating an embodiment of the pattern matching method.

In step 1, the scanning electron microscope 50 generates the image 205 of the first region 201 in the pattern region 200 including the repeating patterns (see FIG. 3). The image 205 of the first region 201 is sent to the arithmetic system 150.

In step 2, the arithmetic system 150 performs the first matching between the reference patterns 210A, 210B on the image 205 of the first region 201 and the CAD patterns 215A, 215B that have been classified in advance into a first group and a second group based on the layer information (see FIG. 4).

In step 3, the arithmetic system 150 classifies the plurality of reference patterns 210A and 210B into the first group and the second group according to the layer classification of the CAD patterns 215A and 215B (see FIG. 5).

In step 4, the arithmetic system 150 measures the widths of the plurality of reference patterns 210A belonging to the first group and the widths of the plurality of reference patterns 210B belonging to the second group.

In step 5, the arithmetic system 150 integrates the measured values of the widths of the plurality of reference patterns 210A belonging to the first group to determine the first integrated value, and integrates the measured values of the widths of the plurality of reference patterns 210B belonging to the second group to determine the second integrated value.

In step 6, the arithmetic system 150 determines the magnitude relationship between the first integrated value and the second integrated value. Specifically, the arithmetic system 150 determines which of the first integrated value and the second integrated value is larger than the other.

In step 7, the scanning electron microscope 50 generates the image 225 of the second region 202 in the pattern region 200 (see FIG. 8). The image 225 of the second region 202 is sent to the arithmetic system 150.

In step 8, the arithmetic system 150 performs the second matching between the patterns 220A, 220B on the image 225 of the second region 202 and the CAD patterns 230A, 230B that have been classified in advance into a first group and a second group based on the layer information (see FIG. 9).

In step 9, the arithmetic system 150 classifies the plurality of patterns 220A and 220B on the image 225 of the second region 202 into the first group and the second group according to the layer classification of the CAD patterns 230A and 230B (see FIG. 10).

In step 10, the arithmetic system 150 measures the widths of the plurality of patterns 220A belonging to the first group and the widths of the plurality of patterns 220B belonging to the second group.

In step 11, the arithmetic system 150 integrates the measured values of the widths of the plurality of patterns 220A belonging to the first group to determine the third integrated value, and integrates the measured values of the widths of the plurality of patterns 220B belonging to the second group to determine the fourth integrated value.

In step 12, the arithmetic system 150 determines the magnitude relationship between the third integrated value and the fourth integrated value.

In step 13, the arithmetic system 150 compares the magnitude relationship between the third integrated value and the fourth integrated value with the magnitude relationship between the first integrated value and the second integrated value, and determines whether the second matching has been correctly performed based on the comparison result. Specifically, the arithmetic system 150 determines that the second matching has been performed correctly when the magnitude relationship between the third integrated value and the fourth integrated value coincides with the magnitude relationship between the first integrated value and the second integrated value. When the magnitude relationship between the third integrated value and the fourth integrated value does not coincide with the magnitude relationship between the first integrated value and the second integrated value, the arithmetic system 150 shifts the plurality of patterns 220A and 220B on the image 225 of the second region 202 by one pitch relative to the plurality of corresponding CAD patterns 230A and 230B, and then performs the second matching again.

In the above-described embodiments, the repeating patterns are formed by the double patterning, but the present invention is not limited to the above-described embodiments. The present invention is also applicable to repeating patterns formed by other multi-patterning, such as quadruple patterning. For example, patterns formed by the quadruple patterning are classified into four groups according to layer classification of corresponding CAD patterns, four integrated values are calculated for these four groups, and a magnitude relation of these four integrated values is determined.

Figure 12:
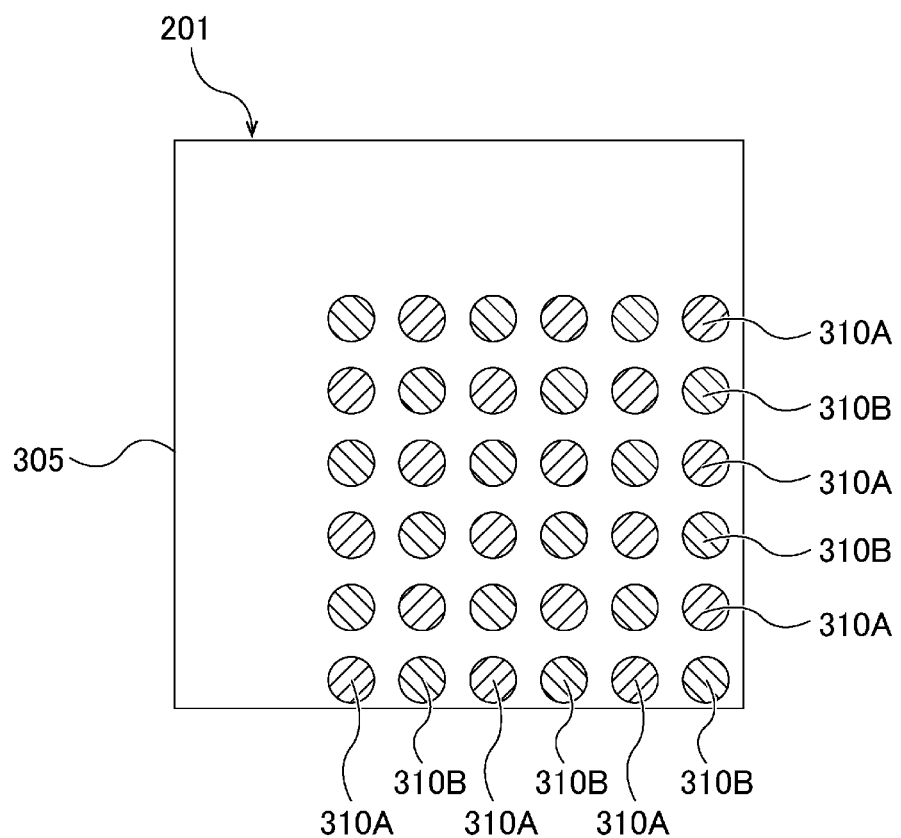
FIG. 12 is a schematic diagram showing another example of an image of a first region.

Furthermore, the present invention can be applied to repeating patterns other than the line and space patterns. FIG. 12 is a schematic diagram showing hole patterns on an image 305 of a first region 201. The hole patterns are an example of repeating patterns formed by the double patterning. In the example shown in FIG. 12, the hole patterns on the image 305 includes two sets of hole patterns 310A, 310B individually formed by the double patterning. These patterns 310A and 310B are arranged alternately in the X direction and the Y direction. In the following descriptions, these hole patterns 310A and 310B will be referred to as reference patterns. In order to specify the positions of the reference patterns 310A and 310B in the X direction and the Y direction, the first region 201 is an edge region and a corner region of the pattern region 200 shown in FIG. 2.

The arithmetic system 150 classifies the reference patterns 310A and 310B into a first group and a second group according to layer classification of corresponding CAD patterns. In one embodiment, the arithmetic system 150 classifies the first reference pattern 310A into the first group and the second reference pattern 310B into the second group.

Figure 13:
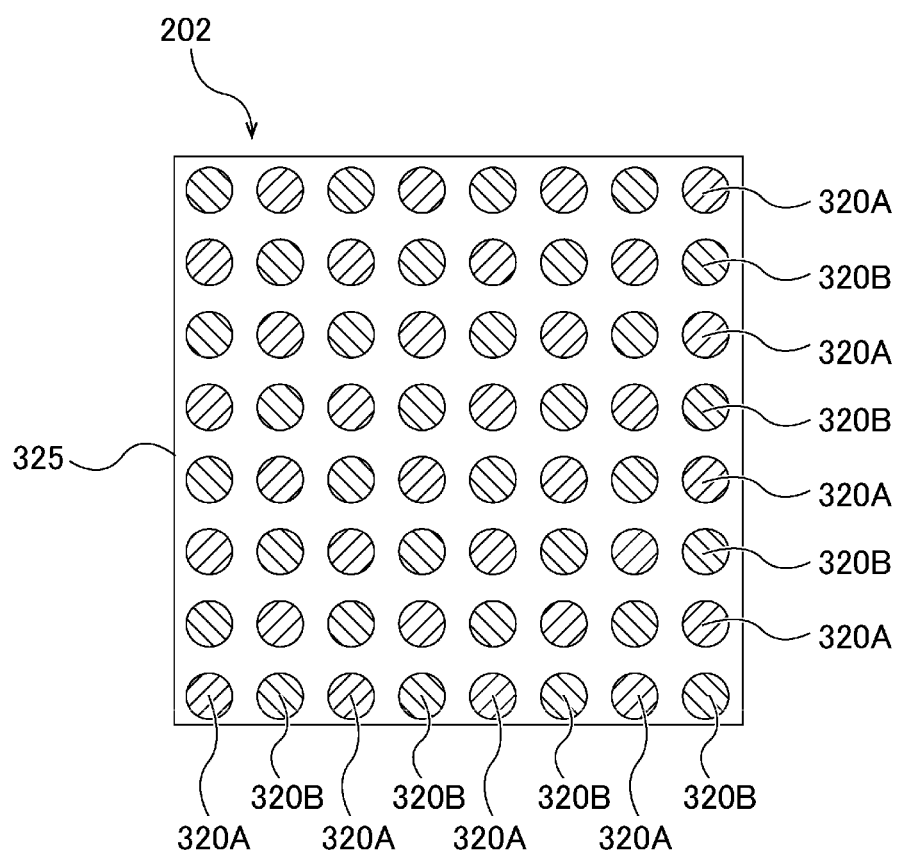
FIG. 13 is a schematic diagram showing another example of an image in a second region.

FIG. 13 is a schematic diagram showing hole patterns on an image 325 of a second region 205. As shown in FIG. 13, the patterns constituted of the hole patterns in the second region 202 include two sets of patterns 320A and 320B individually formed by the double patterning. These patterns 320A and 320B are arranged alternately in the X direction and the Y direction. The arithmetic system 150 classifies the hall patterns 320A and 320B into a first group and a second group according to layer classification of corresponding CAD patterns. In one embodiment, the arithmetic system 150 classifies the hall pattern 320A into the first group and the ball pattern 320B into the second group.

The pattern matching of this embodiment is performed in the same manner as the embodiment described with reference to FIG. 11.

In step 1, the scanning electron microscope 50 generates the image 305 of the first region 201 in the pattern region 200 including the repeating patterns (see FIG. 12). The image 305 of the first region 201 is sent to the arithmetic system 150.

In step 2, the arithmetic system 150 performs the first matching between the reference patterns 310A, 310B on the image 305 of the first region 201 and the CAD patterns that have been classified in advance into a first group and a second group based on the layer information.

In step 3, the arithmetic system 150 classifies the plurality of reference patterns 310A and 310B into the first group and the second group according to the layer classification of the corresponding CAD patterns.

In step 4, the arithmetic system 150 measures widths of the plurality of reference patterns 310A belonging to the first group and widths of the plurality of reference patterns 310B belonging to the second group.

In step 5, the arithmetic system 150 integrates the measured values of the widths of the plurality of reference patterns 310A belonging to the first group to determine a first integrated value, and integrates the measured values of the widths of the plurality of reference patterns 310B belonging to the second group to determine a second integrated value.

In step 6, the arithmetic system 150 determines a magnitude relationship between the first integrated value and the second integrated value. Specifically, the arithmetic system 150 determines which of the first integrated value and the second integrated value is larger than the other.

In step 7, the scanning electron microscope 50 generates the image 325 of the second region 202 in the pattern region 200 (see FIG. 13). The image 325 of the second region 202 is sent to the arithmetic system 150.

In step 8, the arithmetic system 150 performs the second matching between the patterns 320A, 320B on the image 325 of the second region 202 and the CAD patterns that have been classified in advance into a first group and a second group based on the layer information.

In step 9, the arithmetic system 150 classifies the plurality of patterns 320A and 320B on the image 325 of the second region 202 into the first group and the second group according to the layer classification of the corresponding CAD patterns.

In step 10, the arithmetic system 150 measures widths of the plurality of patterns 320A belonging to the first group and widths of the plurality of patterns 320B belonging to the second group.

In step 11, the arithmetic system 150 integrates the measured values of the widths of the plurality of patterns 320A belonging to the first group to determine a third integrated value, and integrates the measured values of the widths of the plurality of patterns 320B belonging to the second group to determine a fourth integrated value.

In step 12, the arithmetic system 150 determines a magnitude relationship between the third integrated value and the fourth integrated value.

In step 13, the arithmetic system 150 compares the magnitude relationship between the third integrated value and the fourth integrated value with the magnitude relationship between the first integrated value and the second integrated value, and determines whether the second matching has been correctly performed based on the comparison result. Specifically, the arithmetic system 150 determines that the second matching has been performed correctly when the magnitude relationship between the third integrated value and the fourth integrated value coincides with the magnitude relationship between the first integrated value and the second integrated value. When the magnitude relationship between the third integrated value and the fourth integrated value does not coincide with the magnitude relationship between the first integrated value and the second integrated value, the arithmetic system 150 shifts the plurality of patterns on the image 325 of the second region 202 by one pitch relative to the plurality of corresponding CAD patterns, and then performs the second matching again.

In the embodiments described previously, the integrated value of the widths of the patterns belonging to each group is calculated. Instead of the widths of the patterns, an integrated value of slopes of brightness profiles of edges of patterns on an image may be calculated. Usually, in the multi-patterning, slopes of edges of real patterns formed by individual steps may be slightly different due to an etching process. Therefore, the slopes of the brightness profiles of the edges of the patterns appearing on the image are also slightly different between groups.

Figure 14:
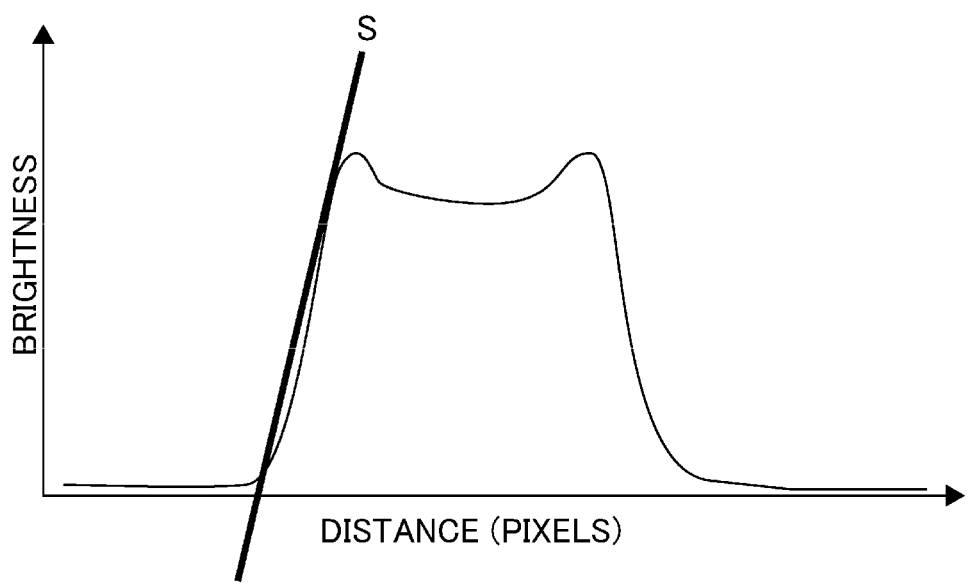
FIG. 14 is a diagram showing an example of a brightness profile of a pattern on an image.

FIG. 14 is a diagram showing an example of a brightness profile of a pattern on an image. The brightness profile of the pattern is a distribution of brightness along a direction across the pattern. The brightness is represented by, for example, a numerical value ranging from 0 to 255 according to a gray scale. As can be seen from FIG. 14, a slope S of the brightness profile of the edge of the pattern can be calculated from brightness values and a distance (number of pixels).

Hereinafter, in the examples shown in FIGS. 2 to 5, an embodiment in which the slope of the brightness profile of the edge of the pattern is used instead of the width of the pattern will be described. Since the details of the following embodiments, which will not be particularly described, are the same as the details of the embodiments described with reference to FIGS. 2 to 13, the duplicated descriptions thereof will be omitted.

Figure 15:
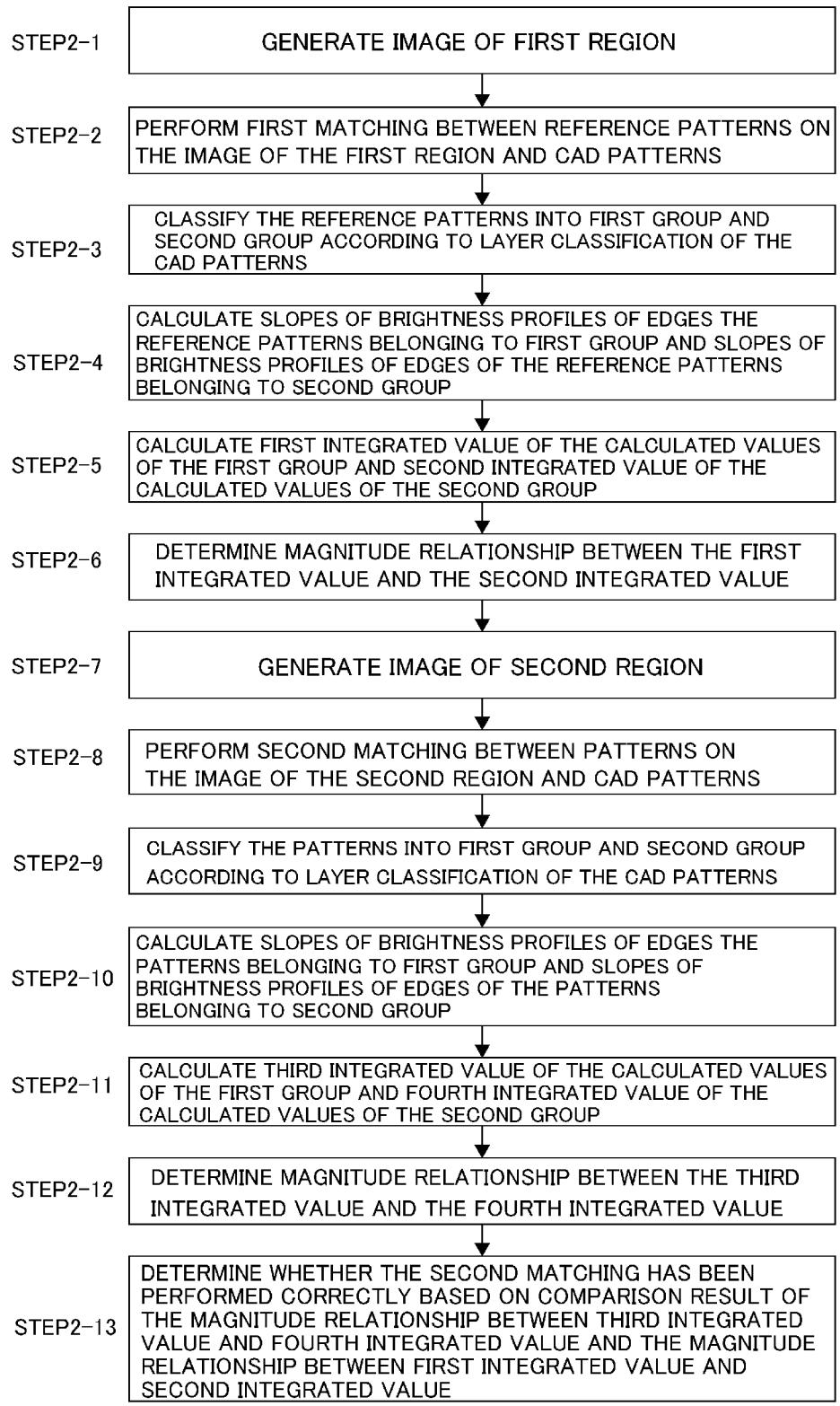
FIG. 15 is a flowchart explaining an embodiment of a pattern matching method.

FIG. 15 is a flowchart illustrating an embodiment of a pattern matching method using the slope of the brightness profile of the pattern edge.

In step 2-1, the scanning electron microscope 50 generates the image 205 of the first region 201 in the pattern region 200 including the repeating patterns (see FIG. 3). The image 205 of the first region 201 is sent to the arithmetic system 150.

In step 2-2, the arithmetic system 150 performs the first matching between the reference patterns 210A, 210B on the image 205 of the first region 201 and the CAD patterns 215A, 215B that have been classified in advance into a first group and a second group based on the layer information (see FIG. 4).

In step 2-3, the arithmetic system 150 classifies the plurality of reference patterns 210A and 210B into the first group and the second group according to the layer classification of the CAD patterns 215A and 215B (see FIG. 5).

In step 2-4, the arithmetic system 150 calculates slopes of brightness profiles of the edges of the plurality of reference patterns 210A belonging to the first group and slopes of brightness profiles of the edges of the plurality of reference patterns 210B belonging to the second group.

In step 2-5, the arithmetic system 150 integrates the calculated values of the slopes of the brightness profiles of the edges of the plurality of reference patterns 210A belonging to the first group to determine a first integrated value, and integrates the calculated values of the slopes of the brightness profiles of the edges of the plurality of reference patterns 210B belong to the second group to determine a second integrated value.

The difference between the slope of the brightness profile of the edge of each reference pattern 210A belonging to the first group and the slope of the brightness profile of the edge of each reference pattern 210B belonging to the second group is extremely small, but there is a significant difference between the first integrated value and the second integrated value. In step 2-6, the arithmetic system 150 determines a magnitude relationship between the first integrated value and the second integrated value. Specifically, the arithmetic system 150 determines which of the first integrated value and the second integrated value is larger than the other.

In step 2-7, the scanning electron microscope 50 generates the image 225 of the second region 202 in the pattern region 200 (see FIG. 8). The image 225 of the second region 202 is sent to the arithmetic system 150.

In step 2-8, the arithmetic system 150 performs the second matching between the patterns 220A, 220B on the image 225 of the second region 202 and the CAD patterns 230A, 230B that have been classified in advance into a first group and a second group based on the layer information (see FIG. 9).

In step 2-9, the arithmetic system 150 classifies the plurality of patterns 220A and 220B on the image 225 of the second region 202 into the first group and the second group according to the layer classification of the CAD patterns 230A and 230B (see FIG. 10).

In step 2-10, the arithmetic system 150 calculates slopes of brightness profiles of edges of the plurality of patterns 220A belonging to the first group and slopes of brightness profiles of edges of the plurality of patterns 220B belonging to the second group.

In step 2-11, the arithmetic system 150 integrates the calculated values of the slopes of the brightness profiles of the edges of the plurality of patterns 220A belonging to the first group to determine a third integrated value, and integrates the calculated values of the slopes of the brightness profiles of the edges of the plurality of patterns 220B belonging to the second group to determine a fourth integrated value.

In step 2-12, the arithmetic system 150 determines a magnitude relationship between the third integrated value and the fourth integrated value.

In step 2-13, the arithmetic system 150 compares the magnitude relationship between the third integrated value and the fourth integrated value with the magnitude relationship between the first integrated value and the second integrated value, and determines whether the second matching has been correctly performed based on the comparison result. Specifically, the arithmetic system 150 determines that the second matching has been performed correctly when the magnitude relationship between the third integrated value and the fourth integrated value coincides with the magnitude relationship between the first integrated value and the second integrated value. When the magnitude relationship between the third integrated value and the fourth integrated value does not coincide with the magnitude relationship between the first integrated value and the second integrated value, the arithmetic system 150 shifts the plurality of patterns 220A and 220B on the image 225 of the second region 202 by one pitch relative to the plurality of corresponding CAD patterns 230A and 230B, and then performs the second matching again.

Although detailed descriptions are omitted, the embodiment described with reference to FIG. 15 can be applied to the hole patterns shown in FIGS. 12 and 13 as well.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a method of performing matching between a pattern formed on a surface of a workpiece, such as a wafer or a glass substrate, used for manufacturing semiconductor devices and a CAD pattern created from pattern design data.

REFERENCE SIGNS LIST 50 scanning electron microscope
111 electron gun
112 converging lens
113 X deflector
114 Y deflector
115 objective lens
116 lens controller
117 deflection controller
118 image acquisition device
120 specimen chamber
121 specimen stage
122 stage controller
124 wafer
130 secondary electron detector
131 backscattered electron detector
140 transfer device
150 arithmetic system
161 database 162 memory
163 processor
165 display screen
200 pattern region
201 first region
202 second region
205 image
210A, 210B reference pattern
220A, 220B pattern
225 image

The invention claimed is:

1. A pattern matching method comprising:
generating an image of a first region in a pattern region containing patterns formed by multi-patterning;
performing first matching between a plurality of reference patterns on the image of the first region and a plurality of first CAD patterns that have been classified in advance into a first group and a second group according to layer information;
classifying the plurality of reference patterns into the first group and the second group according to the layer classification of the first CAD patterns;
measuring widths of the plurality of reference patterns belonging to the first group and widths of the plurality of reference patterns belonging to the second group;
determining a first integrated value by integrating measured values of the widths of the plurality of reference patterns belonging to the first group;
determining a second integrated value by integrating measured values of the widths of the plurality of reference patterns belonging to the second group;
determining a magnitude relationship between the first integrated value and the second integrated value;
generating an image of a second region in the pattern region;
performing second matching between a plurality of patterns on the image of the second region and a plurality of second CAD patterns that have been classified in advance into a first group and a second group according to layer information;
classifying the plurality of patterns on the image of the second region into the first group and the second group according to the layer classification of the second CAD patterns;
measuring widths of the plurality of patterns belonging to the first group and widths of the plurality of patterns belonging to the second group;
determining a third integrated value by integrating measured values of the widths of the plurality of patterns belonging to the first group;
determining a fourth integrated value by integrating measured values of the widths of the plurality of patterns belonging to the second group;
determining a magnitude relationship between the third integrated value and the fourth integrated value;
determining that the second matching has been performed correctly when the magnitude relationship between the third integrated value and the fourth integrated value coincides with the magnitude relationship between the first integrated value and the second integrated value.

2. The pattern matching method according to claim 1, wherein the first region is an edge region including an edge of the pattern region, and the second region is within the pattern region and is located more inwardly than the first region.

3. The pattern matching method according to claim 1, wherein the patterns formed by the multi-patterning are repeating patterns.

4. The pattern matching method according to claim 1, further comprising:
shifting the plurality of patterns on the image of the second region relative to the plurality of second CAD patterns by one pitch when the magnitude relationship between the third integrated value and the fourth integrated value does not coincide with the magnitude relationship between the first integrated value and the second integrated value; and then
performing the second matching again.

5. The pattern matching method according to claim 1, wherein an absolute value of a difference between the first integrated value and the second integrated value and an absolute value of a difference between the third integrated value and the fourth integrated value are larger than a predetermined value.

6. A pattern matching method comprising:
generating an image of a first region in a pattern region containing patterns formed by multi-patterning;
performing first matching between a plurality of reference patterns on the image of the first region and a plurality of first CAD patterns that have been classified in advance into a first group and a second group according to layer information;
classifying the plurality of reference patterns into the first group and the second group according to the layer classification of the first CAD patterns;
calculating slopes of brightness profiles of edges of the plurality of reference patterns belonging to the first group and slopes of brightness profiles of edges of the plurality of reference patterns belonging to the second group;
determining a first integrated value by integrating calculated values of the slopes of the brightness profiles of the edges of the plurality of reference patterns belonging to the first group;
determining a second integrated value by integrating calculated values of the slopes of the brightness profiles of the edges of the plurality of reference patterns belonging to the second group;
determining a magnitude relationship between the first integrated value and the second integrated value;
generating an image of a second region in the pattern region;
performing second matching between a plurality of patterns on the image of the second region and a plurality of second CAD patterns that have been classified in advance into a first group and a second group according to layer information;
classifying the plurality of patterns on the image of the second region into the first group and the second group according to the layer classification of the second CAD patterns;
calculating slopes of brightness profiles of edges of the plurality of patterns belonging to the first group and slopes of brightness profiles of edges of the plurality of patterns belonging to the second group;
determining a third integrated value by integrating calculated values of the slopes of the brightness profiles of the edges of the plurality of patterns belonging to the first group;

determining a fourth integrated value by integrating calculated values of the slopes of the brightness profiles of the edges of the plurality of patterns belonging to the second group;

determining a magnitude relationship between the third integrated value and the fourth integrated value;

determining that the second matching has been performed correctly when the magnitude relationship between the third integrated value and the fourth integrated value coincides with the magnitude relationship between the first integrated value and the second integrated value.

7. The pattern matching method according to claim 6, wherein the first region is an edge region including an edge of the pattern region, and the second region is within the pattern region and is located more inwardly than the first region.

8. The pattern matching method according to claim 6, wherein the patterns formed by the multi-patterning are repeating patterns.

9. The pattern matching method according to claim 6, further comprising:

shifting the plurality of patterns on the image of the second region relative to the plurality of second CAD patterns by one pitch when the magnitude relationship between the third integrated value and the fourth integrated value does not coincide with the magnitude relationship between the first integrated value and the second integrated value; and then performing the second matching again.

10. The pattern matching method according to claim 6, wherein an absolute value of a difference between the first integrated value and the second integrated value and an absolute value of a difference between the third integrated value and the fourth integrated value are larger than a predetermined value.

* * * * *